US009022714B2

(12) United States Patent
Lee et al.

(10) Patent No.: US 9,022,714 B2
(45) Date of Patent: May 5, 2015

(54) SUBSTRATE PROCESSING SYSTEM AND SUBSTRATE TRANSFERRING METHOD

(75) Inventors: Kyoo Hwan Lee, Yongin-si (KR); Duck Won Moon, Jeju-si (KR); Jae Wook Choi, Seongnam-si (KR)

(73) Assignee: Jusung Engineering Co., Ltd., Seoul (KR)

( * ) Notice: Subject to any disclaimer, the term of this patent is extended or adjusted under 35 U.S.C. 154(b) by 897 days.

(21) Appl. No.: 13/141,055

(22) PCT Filed: Jan. 12, 2010

(86) PCT No.: PCT/KR2010/000184
§ 371 (c)(1),
(2), (4) Date: Jun. 20, 2011

(87) PCT Pub. No.: WO2010/082750
PCT Pub. Date: Jul. 22, 2010

(65) Prior Publication Data
US 2011/0262252 A1   Oct. 27, 2011

(30) Foreign Application Priority Data
Jan. 15, 2009   (KR) .................. 10-2009-0003310

(51) Int. Cl.
H01L 21/677   (2006.01)
H01L 21/67   (2006.01)

(52) U.S. Cl.
CPC ......... H01L 21/67742 (2013.01); *Y10S 901/19* (2013.01); *Y10S 414/135* (2013.01);
(Continued)

(58) Field of Classification Search
USPC .................. 414/217, 222.12, 222.13, 225.01, 414/226.01, 749.1, 749.5, 806, 939
See application file for complete search history.

(56) References Cited

U.S. PATENT DOCUMENTS 4,652,202 A *   3/1987   Kersten .......................... 414/648
6,742,977 B1 *   6/2004   Okayama et al. ............. 414/217
(Continued)

FOREIGN PATENT DOCUMENTS

CN   1674220 A   9/2005
JP   62-297085   12/1987
(Continued)

OTHER PUBLICATIONS

Yasuo Imanishi, Masami Otani, Masao Tsuji, Masaki Iwami, Joichi Nishimura, Akihiko Morita and Takanori Kawamoto; "Substrate Processing Device and Method"; Espacenet; Japanese Publication No. JP 11043221 (A); Publication Date: Feb. 16, 1999; espacenet—Bibliographic data, http://worldwide/publicationDetails/biblio?DB=EPODOC&adjace....
(Continued)

*Primary Examiner* — Scott Lowe
(74) *Attorney, Agent, or Firm* — Andrew D. Fortney; Central California IP Group, P.C.

(57) ABSTRACT

A substrate processing system and substrate transferring method capable of transferring a substrate bi-directionally through the use of substrate transferring device provided between two rows of processing chambers arranged linearly, thereby improving the substrate-transferring efficiency, the substrate processing system includes a transfer chamber having at least one bi-directional substrate transferring device for bi-directionally transferring a substrate; and a plurality of processing chambers for applying a semiconductor-manufacturing process to the substrate, wherein the plurality of processing chambers are linearly arranged along two rows confronting each other, and the transfer chamber is interposed between the two rows of the processing chambers, wherein the bi-directional substrate transferring device have a moving unit inside the transfer chamber, and horizontally moved by a linear motor; and a bi-directional substrate transferring unit in the moving unit, the bi-directional substrate transferring unit transferring the substrate to the processing chamber through a bi-directional sliding movement.

13 Claims, 14 Drawing Sheets

(52) U.S. Cl.
CPC ............ *Y10S 901/14* (2013.01); *Y10S 414/139* (2013.01); *Y10S 901/25* (2013.01); *H01L 21/67173* (2013.01); *H01L 21/67196* (2013.01); *H01L 21/67748* (2013.01)

(56) References Cited

U.S. PATENT DOCUMENTS

| | | | |
|---|---|---|---|
| 7,575,406 | B2 | 8/2009 | Hofmeister et al. |
| 7,905,960 | B2 * | 3/2011 | Choi et al. ............. 118/719 |
| 7,988,398 | B2 * | 8/2011 | Hofmeister et al. ......... 414/217 |
| 8,328,940 | B2 | 12/2012 | Choi et al. |
| 2004/0151562 | A1 | 8/2004 | Hofmeister et al. |
| 2004/0151570 | A1 | 8/2004 | Tanaka |
| 2005/0105991 | A1 * | 5/2005 | Hofmeister et al. ......... 414/217 |
| 2005/0211169 | A1 * | 9/2005 | Choi et al. ............. 118/719 |
| 2006/0216137 | A1 * | 9/2006 | Sakata et al. ............ 414/222.13 |
| 2011/0150608 | A1 | 6/2011 | Choi et al. |

FOREIGN PATENT DOCUMENTS

| | | |
|---|---|---|
| JP | 7-61516 | 3/1995 |
| JP | 8-288362 | 11/1996 |
| JP | 11-19889 A | 1/1999 |
| JP | 11-43221 A | 2/1999 |
| JP | 2003-152050 A | 5/2003 |
| JP | 2004-90186 A | 3/2004 |
| JP | 2008-205160 A | 9/2008 |
| KR | 10-2005-0035247 A | 4/2005 |

OTHER PUBLICATIONS

Tatsuo Tsubaki; "Unmanned Conveying Vehicle"; Patent Abstracts of Japan; Publication No. 11-019889; Publication Date: Jan. 26, 1999; Japan Patent Office, Japan.

Tsutomu Kamiyama and Izuru Izeki; "Conveying Mechanism for Flat Material and Thin Film Forming Apparatus"; Espacenet; Japanese Publication No. JP 2003152050 (A); Publication Date: May 23, 2003; espacenet—Bibliographic data, http://worldwide/publicationDetails/biblio?DB=EPODOC&adjace. . . .

Kazuo Kimata, Takao Nakamori, Katsuhiko Kato and Kiyonori Nakano; "Clean Transfer Robot"; Patent Abstracts of Japan; Publication No. 2004-090186; Publication Date: Mar. 25, 2004; Japan Patent Office, Japan.

PCT International Search Report of International Searching Authority; PCT International Application No. PCT/KR2010/000184; Dated Aug. 24, 2010; 6 pages; International Searching Authority/Korean Intellectual Property Office, Republic of Korea.

Office Action dated Feb. 5, 2013 from the State Intellectual Property Office of the P.R.C.; Chinese Patent Application No. 201080004741.7.

Yoshida Hisashi et al.; Wafer Transferring Machine; Abstract of JP7-61516; Mar. 7, 1995; http://www19.ipdl.inpit.go.jp/.

Yamagami Takashi; Plate-Shaped Member Transporting Apparatus and Plate-Shaped Member Treating Apparatus Using It; Abstract of JP8-288362; Nov. 1, 1996; http://www19.ipdl.inpitgo.jp/.

Transferring Device Which Expands and Contracts in Both Directions; Abstract of JP62-297085; Dec. 24, 1987.

Taiwanese Office Action dated Sep. 9, 2014, Taiwan Intellectual Property Office, 13 pages.

English Abstract of CN1674220 (A); Sep. 28, 2005; http://worldwide.espacenet.com.

Office Action of KR10-2009-0003310 dated Jan. 13, 2015, from Korean Intellectual Property Office; 5 pgs.

Hirata, Kensuke; "Substrate Transfer Machine"; Sep. 4, 2008; Abstract of JP2008205160 (A); 2 pgs.; www.espacenet.com.

Hofmeister, Christopher A.; Caveney, Robert T.; Weiss, Mitchell; "Substrate Processing Apparatus"; Apr. 15, 2005; Abstract of KR1020050035247 A; KIPO Korean Patent Abstracts CD Rom.

Hofmeister, Christopher A.; "Substrate Processing Apparatus"; Jan. 29, 2004; WO2004010476 (A2); 85 pgs. www.espacenet.com.

* cited by examiner

`US 9,022,714 B2`

SUBSTRATE PROCESSING SYSTEM AND SUBSTRATE TRANSFERRING METHOD

BACKGROUND OF THE INVENTION

1. Field of the Invention

The present invention relates to a substrate processing system, and more particularly, a substrate processing system and a substrate transferring method, which is capable of improving substrate-transferring efficiency by transferring a substrate bi-directionally through the use of substrate transferring device provided between two rows of processing chambers arranged linearly.

2. Discussion of the Related Art

Generally, a flat display device and a semiconductor device such as a solar cell can be manufactured by selectively and repetitively applying a plurality of semiconductor-manufacturing processes on a substrate, for example, a deposition process, a photo process, an etching process, a diffusion process, and an ion-implantation process. For smoothly performing the respective semiconductor-manufacturing processes, there is a requirement for a substrate processing system with a multi-chamber structure.

The substrate processing system with the multi-chamber structure is formed in a cluster type including a plurality of processing chambers and a transfer chamber, wherein the plurality of processing chambers carry out at least one process, and the transfer chamber connects the plurality of processing chambers in common.

The transfer chamber is provided with a substrate transferring device to transfer the externally-provided substrate.

The substrate transferring device loads the substrate to each of the processing chambers, or unloads the substrate from each of the processing chambers by lift and rotation movements of a transferring robot.

However, the related art substrate processing system has the following disadvantages.

First, the substrate is transferred to each of the processing chambers arranged in the cluster type by the rotation of the transferring robot, whereby the yield is lowered due to the increased load of the transferring robot.

Also, because a space for the rotation of the transferring robot has to be ensured, the transfer chamber is increased in size, whereby it causes the increase of maintenance time for the transfer chamber.

SUMMARY OF THE INVENTION

Accordingly, the present invention is directed to a substrate processing system and a substrate transferring method that substantially obviates one or more problems due to limitations and disadvantages of the related art.

An object of the present invention is to provide a substrate processing system and a substrate transferring method, which is capable of transferring a substrate bi-directionally through the use of substrate transferring device provided between two rows of processing chambers arranged linearly, thereby improving the substrate-transferring efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a substrate processing system comprising a transfer chamber having at least one bi-directional substrate transferring device for bi-directionally transferring a substrate; and a plurality of processing chambers for applying a semiconductor-manufacturing process to the substrate, wherein the plurality of processing chambers are linearly arranged along two rows confronting each other, and the transfer chamber is interposed between the two rows of the processing chambers, wherein the at least one bi-directional substrate transferring device comprises a moving unit provided inside the transfer chamber, and horizontally moved; and a bi-directional substrate transferring unit provided in the moving unit, the bi-directional substrate transferring unit for transferring the substrate to the processing chamber through a bi-directional sliding movement.

At this time, the bi-directional substrate transferring unit comprises a base frame provided in the moving unit; a fork frame provided on the base frame; first and second bi-directional sliding forks bi-directional slidably provided in the fork frame; and a fork lift provided at a lateral side of the fork frame, the fork lift for lifting or lowering the first and second bi-directional sliding forks by lifting or lowering the fork frame.

The fork frame comprises a first support frame lifted or lowered by the fork lift; a plurality of sidewall supporters provided along the edge of the first support frame; and a second support frame confronting the first support frame, the second support frame provided in the plurality of sidewall supporters.

The fork lift comprises first and second lift supporters provided vertical to the base frame; first and second lifting units respectively provided adjacent to inner lateral sides of the first and second lift supporters; a first frame lifting member provided between the first lift supporter and the first lifting member while passing through the first support frame, the first frame lifting member for lifting or lowering the fork frame by driving of the first lifting unit; a second frame lifting member provided between the second lift supporter and the second lifting unit while passing through the first support frame, the second frame lifting member for lifting or lowering the fork frame by driving of the second lifting unit; and an interlock member provided between the first and second lifting units, the interlock members for interlocking the rotation of the first and second lifting units.

The bi-directional substrate transferring unit further comprises a fork lift guide for guiding the lifting or lowering movement of the fork frame through the use of fork lift.

The fork lift guide comprises a plurality of first lift guide members provided in the sidewall supporters corresponding to the both lateral sides of the fork frame; and a second lift guide member provided for being in contact with each first lift guide member, and provided for being vertical to the base frame so as to guide the lifting or lowering movement of each first lift guide member when the fork frame is lifted or lowered.

Each of the first and second bi-directional sliding forks comprises at least two sliding forks bi-directional slidably provided while being in parallel to the first or second support frame.

Each of the at least two sliding forks comprises a guide block provided in the support frame; a plurality of sliding members bi-directional slidably provided in the guide block; and a fork slider for bi-directionally sliding the plurality of sliding members, the fork slider provided in each of the first and second support frames.

In another aspect of the present invention, a substrate processing system comprises first and second processing chambers confronting each other arranged in parallel, the first and second processing chambers for applying a semiconductor-manufacturing process to a substrate; and at least one bi-directional substrate transferring device provided between the first and second processing chambers, the at least one bi-directional substrate transferring device for transferring the substrate to the first or second processing chamber by simultaneously sliding a plurality of sliding members.

The at least one bi-directional substrate transferring device slides bi-directionally while being extended or retracted by a hydraulic or pneumatic pressure.

In another aspect of the present invention, a substrate transferring method for transferring a substrate to first and second processing chambers confronting each other arranged in parallel, the first and second processing chambers for applying a semiconductor-manufacturing process to the substrate, comprises moving at least one bi-directional substrate transferring device to a predetermined space between the first and second processing chambers; and transferring the substrate to the first or second processing chamber by simultaneously sliding a plurality of sliding members, wherein the plurality of sliding members are bi-directional slidably provided while being in parallel to the at least one bi-directional substrate transferring device.

The at least one bi-directional substrate transferring device is moved by a linear motor, and the plurality of sliding members slide bi-directionally while being extended or retracted by a hydraulic or pneumatic pressure.

The plurality of sliding members slide bi-directionally while being extended or retracted by a linear movement.

The step for transferring the substrate comprises supporting a first substrate loaded into the first processing chamber by extending a plurality of first sliding members from their original positions to the first processing chamber, the first sliding members arranged in parallel to a first bi-directional substrate transferring device corresponding to any one of the at least one bi-directional substrate transferring device; unloading the first substrate from the first processing chamber by retracting the plurality of first sliding members and restoring the plurality of first sliding members with the first substrate supported thereby to their original positions; loading the first substrate unloaded from the first processing chamber into the second processing chamber by extending the plurality of first sliding members restored to their original positions to the second processing chamber; and retracting the plurality of first sliding members, and restoring the plurality of first sliding members to their original positions.

In another aspect of the present invention, a substrate transferring method for transferring a substrate to first and second processing chambers confronting each other arranged in parallel, the first and second processing chambers for applying a semiconductor-manufacturing process to the substrate, comprises moving at least one bi-directional substrate transferring device to a predetermined space between the first and second processing chambers; and transferring the substrate to the first or second processing chamber by linearly moving a plurality of sliding members provided in the at least one bi-directional substrate transferring device.

The at least one bi-directional substrate transferring device is moved by a linear motor, and the plurality of sliding members slide bi-directionally while being extended or retracted by a hydraulic or pneumatic pressure.

The step for transferring the substrate comprises supporting a first substrate loaded into the first processing chamber by extending a plurality of first sliding members from their original positions to the first processing chamber, the first sliding members arranged in parallel to a first bi-directional substrate transferring device corresponding to any one of the at least one bi-directional substrate transferring device; unloading the first substrate from the first processing chamber by retracting the plurality of first sliding members and restoring the plurality of first sliding members with the first substrate supported thereby to their original positions; loading the first substrate unloaded from the first processing chamber into the second processing chamber by extending the plurality of first sliding members restored to their original positions to the second processing chamber; and retracting the plurality of first sliding members, and restoring the plurality of first sliding members to their original positions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a substrate processing system and a substrate transferring method according to the present invention will be described with reference to the accompanying drawings.

Figure 1:
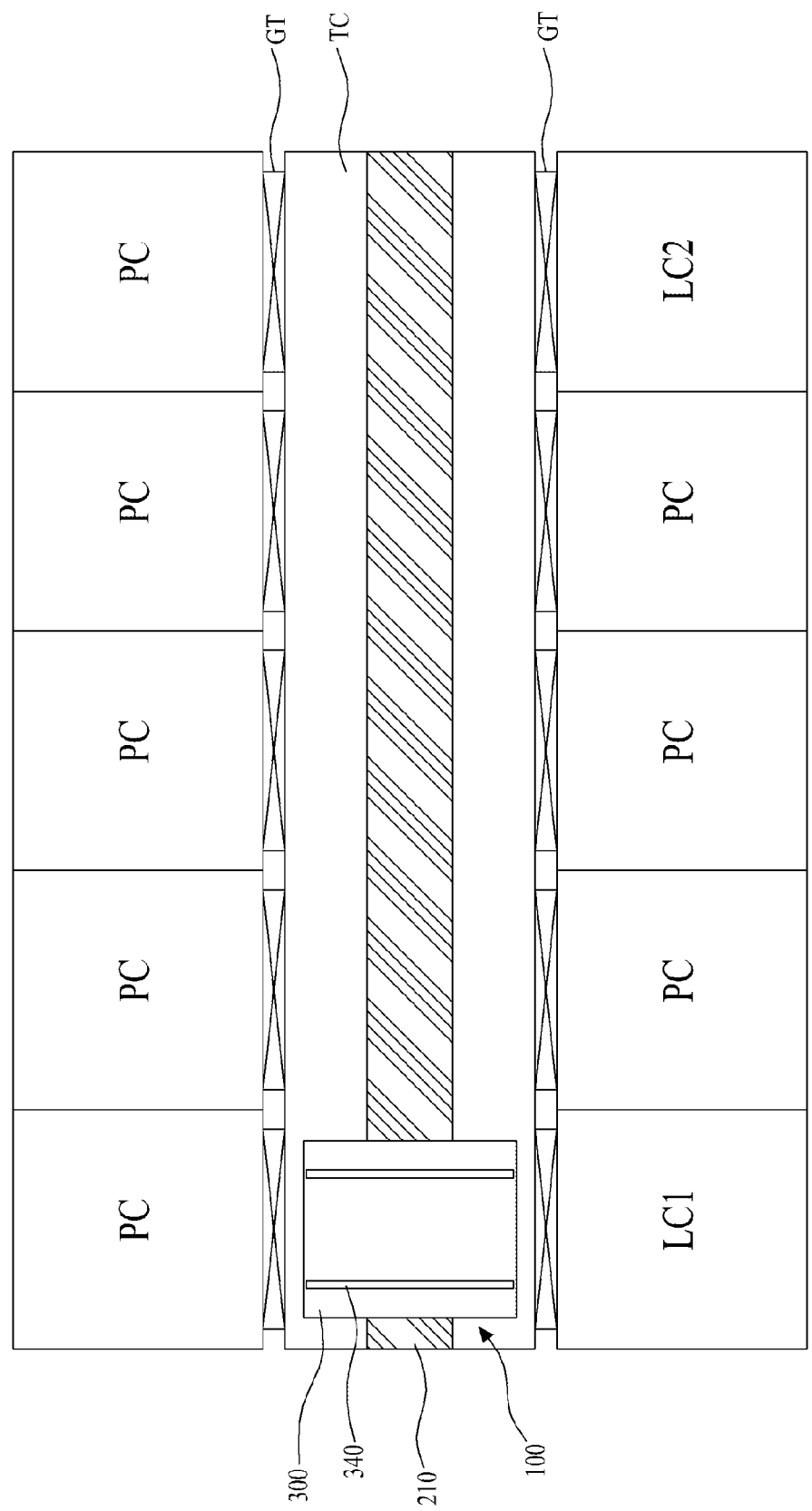
FIG. 1 illustrates a substrate processing system according to the first embodiment of the present invention.

FIG. 1 illustrates a substrate processing system according to the first embodiment of the present invention.

Referring to FIG. 1, the substrate processing system according to the first embodiment of the present invention includes a transfer chamber (TC) for transferring a substrate; at least one load-lock chamber (LC) arranged to be in connection with the transfer chamber (TC); and a plurality of processing chambers (PCs) arranged along two rows confronting each other with the transfer chamber (TC) interposed therebetween in parallel.

The load-lock chamber (LC) may be provided in at least one side of both sides of the transfer chamber (TC). The load-lock chamber (LC) enables to load the substrate (not shown) into the transfer chamber (TC) from the external, or to unload the substrate (not shown) from the transfer chamber (TC) to the external. Between the load-lock chamber (LC) and the transfer chamber (TC), there may be a gate (GT) for easily loading or unloading the substrate therethrough.

Each of the processing chambers (PCs) carries out a corresponding semiconductor-manufacturing process to the substrate transferred from the transfer chamber (TC). At this time, the semiconductor-manufacturing process may be any one process among various processes for manufacturing a semiconductor device such as a flat display device and a solar cell. For example, the semiconductor-manufacturing process may be a deposition process, a cleaning process, a preheating process, a drying process, a heating process, a photo process, an etching process, a diffusion process, or an ion implantation process.

The plurality of processing chambers (PCs) may be linearly arranged in each of upper and lower sides of the transfer chamber (TC). Also, each gate (GT) may be provided between each of the processing chambers (PCs) and the transfer chamber (TC) so that the substrate can be easily loaded or unloaded through the gate (GT).

Between the two rows of the processing chambers (PCs), the transfer chamber (TC) is interposed while being provided with the plurality of gates (GT), wherein each gate (GT) is provided to be in connection with each of the processing chambers (PCs). At this time, the inside of the transfer chamber (TC) may be maintained under the vacuum state.

The transfer chamber (TC) may be provided with a bi-directional substrate transferring device 100 so as to transfer the substrate from the load-lock chamber (LC) to each processing chamber (PC) or to transfer the substrate from each processing chamber (PC) to the load-lock chamber (LC). At this time, the bi-directional substrate transferring device 100 horizontally moves inside the transfer chamber (TC) so as to transfer the substrate among the plurality of processing chambers (PCs).

Figure 2:
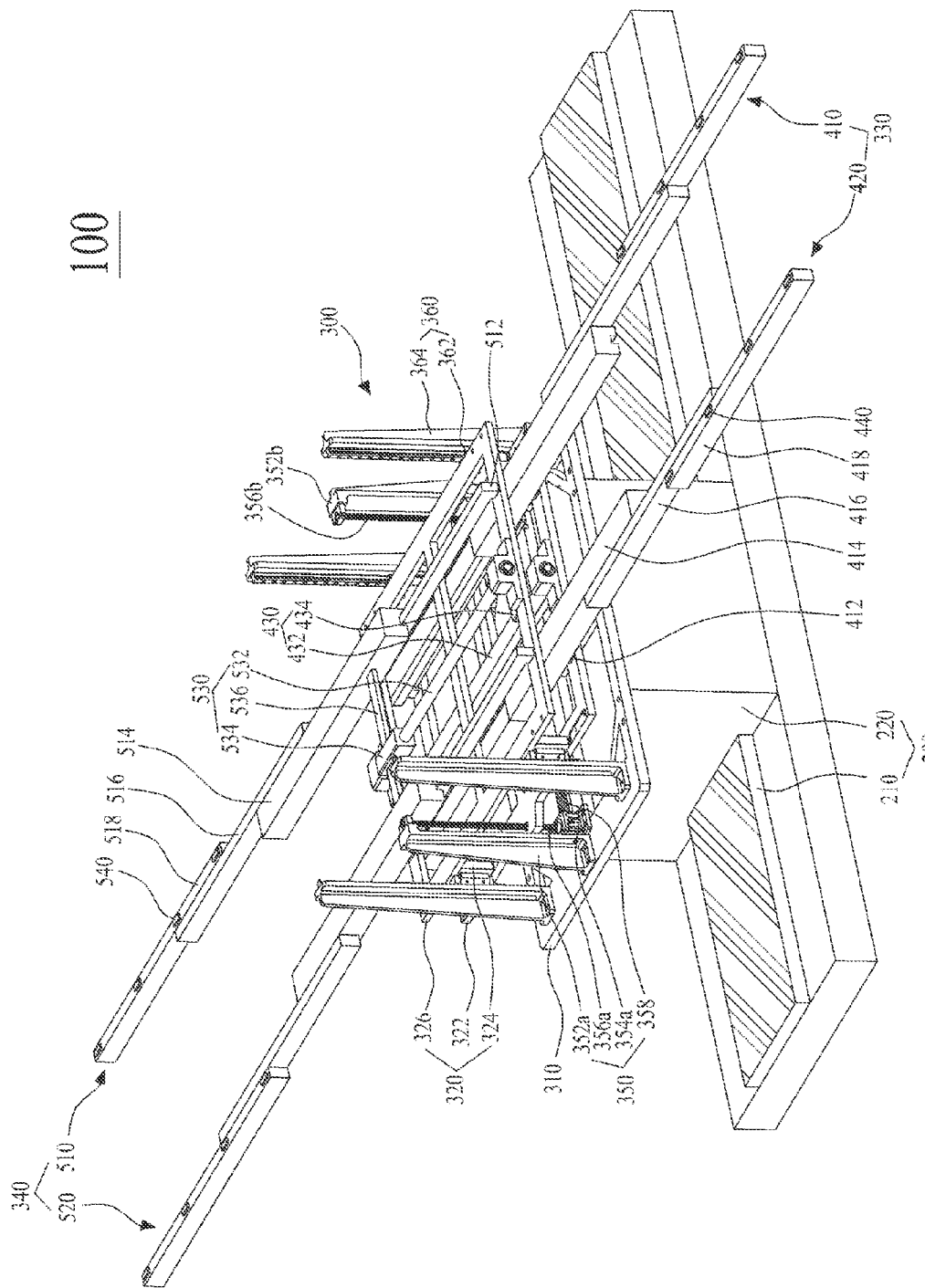
FIG. 2 is a perspective view illustrating a bi-directional substrate transferring device of a transfer chamber according to the first embodiment of the present invention.
Figure 3:
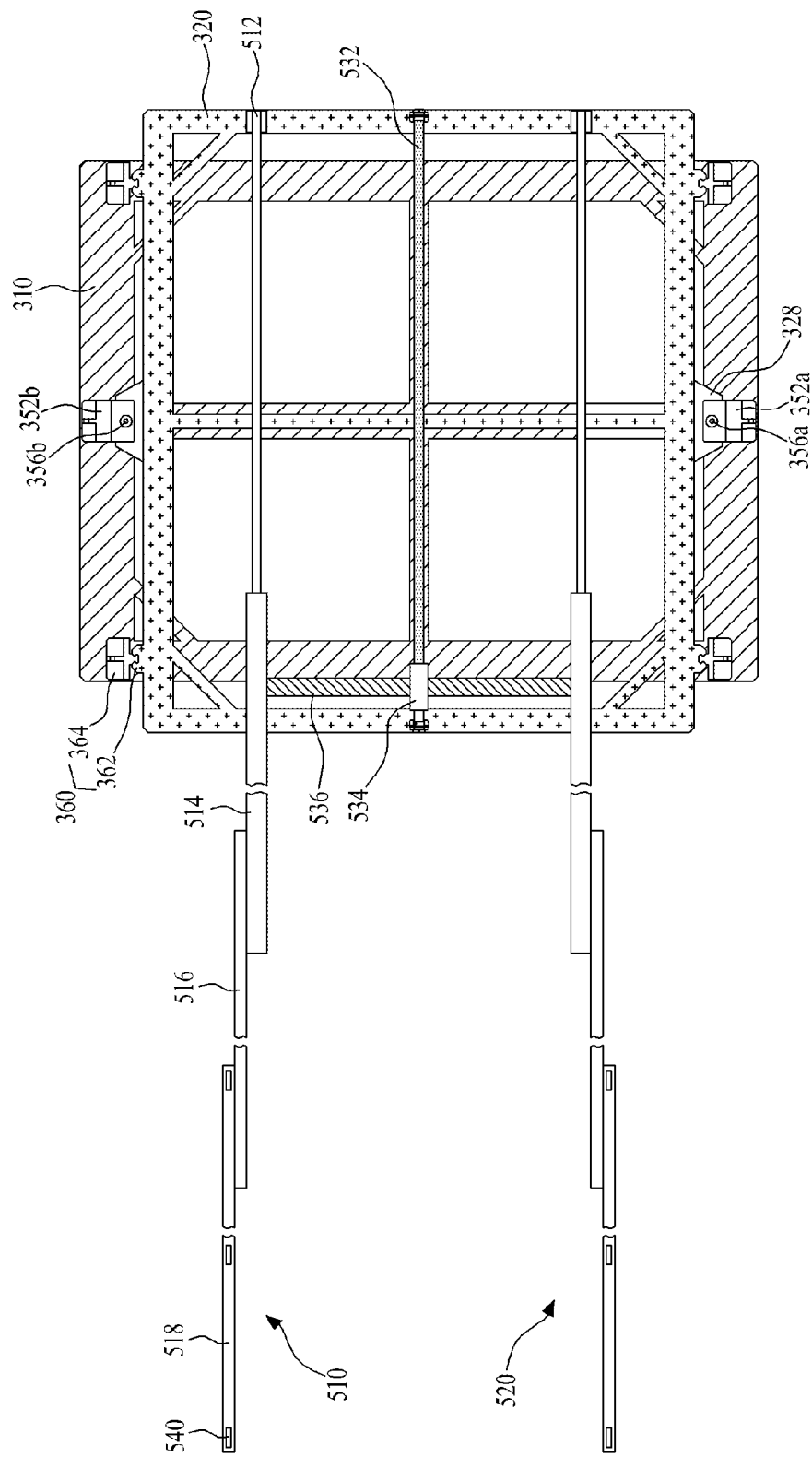
FIG. 3 is a plane view illustrating a bi-directional substrate transferring unit according to the embodiment of the present invention.

FIG. 2 is a perspective view illustrating the bi-directional substrate transferring device according to the embodiment of the present invention. FIG. 3 a plane view illustrating the bi-directional substrate transferring device according to the embodiment of the present invention.

Referring to FIGS. 2 and 3 in connection with FIG. 1, the bi-directional substrate transferring device 100 according to one embodiment of the present invention includes a moving unit 200 and a bi-directional substrate transferring unit 300.

The moving unit 200 according to one embodiment of the present invention is provided in a longitudinal direction of the transfer chamber (TC) so as to horizontally move the bi-directional substrate transferring unit 300. For this, the moving unit 200 may be formed of a linear motor.

In one embodiment of the present invention, the moving unit 200 includes a moving guider 210 and a moving block 220.

The moving guider 210 guides a horizontal movement of the moving block 220. For example, the moving guider 210 may be a stator for the linear motor.

The moving block 220 may be movably provided in the moving guider 210 so that the moving block 220 may be horizontally moved along the moving guider 210. For example, the moving block 220 may be a rotor (or coil) for the linear motor.

In one embodiment of the present invention, the bi-directional substrate transferring unit 300 includes a base frame 310, a fork frame 320, first and second bi-directional sliding forks 330 and 340, a fork lift 350, and a fork lift guide 360.

The base frame 310 is provided on the moving block 220 of the moving unit 200, whereby the base frame 310 horizontally moves together with the moving block 220.

The fork frame 320 according to one embodiment of the present invention includes a first support frame 322, a plurality of sidewall supporters 324, and a second support frame 326.

The first support frame 322 is provided at a predetermined height on the base frame 310, wherein the first support frame 322 is supported to be lifted or lowered by the fork lift 350. At this time, protrusions 328 are provided at first and second lateral sides of the first support frame 322, wherein the fork lift 350 passes through the protrusions 328 while being in contact with the protrusions 328.

According as the plurality of sidewall supporters 324 are provided at fixed intervals along the edge of the first support frame 322, the plurality of sidewall supporters 324 support the second support frame 326.

The second support frame 326 is provided on the plurality of sidewall supporters 324 while the second support frame 326 is overlapped with the first support frame 322. Also, the second support frame 326 is lifted and lowered together with the first support frame 322.

The first bi-directional sliding fork 330 according to one embodiment of the present invention includes first and second sliding forks 410 and 420, a first fork slider 430, and a plurality of first substrate-supporting pads 440.

The first and second sliding forks 410 and 420 are provided on the first support frame 322, wherein the first and second sliding forks 410 and 420 are provided in parallel at a predetermined interval therebetween. According to an operation of the first fork slider 430, the first and second sliding forks 410 and 420 may be moved to a first or second horizontal direction, wherein the first and second horizontal directions are opposite to each other. For this, each of the first and second sliding forks 410 and 420 includes a first guide block 412, and first to third sliding members such as first to third sliding bars 414, 416 and 418.

The first guide block 412 is provided on the first support frame 322, and more particularly, between both lateral sides of the first support frame 322, wherein the first guide block 412 guides the sliding movement of the first sliding bar 414.

The first sliding bar 414 is provided in the first guide block 412. According to an operation of the first fork slider 430, the first sliding bar 414 may be moved to the first or second horizontal direction, wherein the first and second horizontal directions are opposite to each other.

The second sliding bar 416 is provided at a lateral side of the first sliding bar 414. That is, according as the second sliding bar 416 is interlocked with the first sliding bar 414, the second sliding bar 416 moves horizontally following the sliding movement of the first sliding bar 414.

The third sliding bar 418 is provided at a lateral side of the second sliding bar 416. That is, according as the third sliding bar 418 is interlocked with the second sliding bar 416, the third sliding bar 418 moves horizontally following the sliding movement of the second sliding bar 416.

The second and third sliding bars 416 and 418 are sequentially provided on the first sliding bar 414. Thus, the second and third sliding bars 416 and 418 may be moved horizontally following the sliding movement of the first sliding bar 414.

The first fork slider 430 is provided on the first support frame 322, and more particularly, between both lateral sides of the first support frame 322, so that the first fork slider 430 is provided between the first and second sliding forks 410 and 420. Thus, the first fork slider 430 moves both the first and second sliding forks 410 and 420 simultaneously to the first or second horizontal direction, wherein the first and second horizontal direction are opposite to each other. For this, the first fork slider 430 includes a first guide bar 432 and a first moving cylinder 434. At this time, the first guide bar 432 is provided on the first support frame 322, and more particularly, between both lateral sides of the first support frame 322, so that the first fork slider 430 is supported by a bracket. Also, the first moving cylinder 434 is movably provided in the first guide bar 432, wherein the first moving cylinder 434 includes a link (not shown) connected with the respective first and second sliding forks 410 and 420. The first fork slider 430 may be formed of a hydraulic or pneumatic cylinder to move the first moving cylinder 434 by a hydraulic or pneumatic pressure supplied to at least one side of the first guide bar 432.

The plurality of first substrate-supporting pads 440 are provided at fixed intervals on the third sliding bar 418, wherein the plurality of first substrate-supporting pads 440 support one rear surface of the substrate during the process for transferring the substrate.

The aforementioned embodiment of the present invention discloses that the first bi-directional sliding fork 330 includes the two sliding forks 410 and 420, but not necessarily. For stably transferring the substrate, the number of sliding forks included in the first bi-directional sliding fork 330 may be more than two. Also, the aforementioned embodiment of the present invention discloses that the first fork slider 430 of the first bi-directional sliding fork 330 is formed of the hydraulic or pneumatic cylinder, but not necessarily. The sliding forks 410 and 420 may slide through the use of at least two among an LM guider, a ball screw, and a belt, without using the first fork slider 430. Furthermore, the first bi-directional sliding fork 330 may slide the sliding forks 410 and 420 in an electromagnetic motor type obtained by combining at least one or two of the LM guider, the ball screw and the belt, without using the first fork slider 430.

The first bi-directional sliding fork 330 may further include a position-detecting sensor to control the first fork slider 430 by detecting a sliding position for the bi-directional sliding of the sliding bars 414, 416 and 418.

The first bi-directional sliding fork 330 simultaneously slides both the first and second sliding forks 410 and 420 to the first or second horizontal direction by extending or retracting the first and second sliding forks 410 and 420 through the use of first fork slider 430, wherein the first and second horizontal directions are opposite to each other. Thus, the substrate can be bi-directionally transferred to any one of the processing chambers (PCs) arranged along the upper and lower sides of the transfer chamber (TC).

The second bi-directional sliding fork 340 according to one embodiment of the present invention may include third and fourth sliding forks 510 and 520, a second fork slider 530, and a plurality of second substrate-supporting pads 540.

The third and fourth sliding forks 510 and 520 are provided on the second support frame 326, wherein the third and fourth sliding forks 510 and 520 are provided in parallel at a predetermined interval therebetween. According to an operation of the second fork slider 530, the third and fourth sliding forks 510 and 520 may be moved to the first or second horizontal direction, wherein the first and second horizontal directions are opposite to each other. For this, each of the third and fourth sliding forks 510 and 520 includes a second guide block 512, and fourth to sixth sliding bars 514, 516 and 516.

The second guide block 512 is provided on the second support frame 326, and more particularly, between both lateral sides of the second support frame 326, wherein the second guide block 512 guides the sliding movement of the fourth sliding bar 514.

The fourth sliding bar 514 is provided in the second guide block 512. According to an operation of the second fork slider 530, the fourth sliding bar 514 may be moved to the first or second horizontal direction, wherein the first and second horizontal directions are opposite to each other.

The fifth sliding bar 516 is provided at a lateral side of the fourth sliding bar 514. That is, according as the fifth sliding bar 516 is interlocked with the fourth sliding bar 514, the fifth sliding bar 516 moves horizontally following the sliding movement of the fourth sliding bar 514.

The sixth sliding bar 518 is provided at a lateral side of the fifth sliding bar 516. That is, according as the sixth sliding bar 518 is interlocked with the fifth sliding bar 516, the sixth sliding bar 518 moves horizontally following the sliding movement of the fifth sliding bar 516.

The fifth and sixth sliding bars 516 and 518 are sequentially provided on the fourth sliding bar 514. Thus, the fifth and sixth sliding bars 516 and 518 may be moved horizontally following the sliding movement of the fourth sliding bar 514.

The second fork slider 530 is provided on the second support frame 326, and more particularly, between both lateral sides of the second support frame 326, so that the second fork slider 530 is provided between the third and fourth sliding forks 510 and 520. Thus, the second fork slider 530 moves both the third and fourth sliding forks 510 and 520 simultaneously to the first or second horizontal direction, wherein the first and second horizontal direction are opposite to each other. For this, the second fork slider 530 includes a second guide bar 532 and a second moving cylinder 534. At this time, the second guide bar 532 includes a second guide bar 532 and a second moving cylinder 534. The second guide bar 532 is provided on the second support frame 326, and more particularly, between both lateral sides of the second support frame 326, so that the second fork slider 530 is supported by a bracket. Also, the second moving cylinder 534 is movably provided in the second guide bar 532, wherein the second moving cylinder 534 includes a link 536 connected with the respective third and fourth sliding forks 510 and 520. The second fork slider 530 may be formed of a hydraulic or pneumatic cylinder to move the second moving cylinder 534 by a hydraulic or pneumatic pressure supplied to at least one side of the second guide bar 532.

The plurality of second substrate-supporting pads 540 are provided at fixed intervals on the sixth sliding bar 518, wherein the plurality of second substrate-supporting pads 540 support one rear surface of the substrate during the process for transferring the substrate.

The aforementioned embodiment of the present invention discloses that the second bi-directional sliding fork 340 includes the two sliding forks 510 and 520, but not necessarily. For stably transferring the substrate, the number of sliding forks included in the second bi-directional sliding fork 340 may be more than two. Also, the aforementioned embodiment of the present invention discloses that the second fork slider 530 of the second bi-directional sliding fork 340 is formed of the hydraulic or pneumatic cylinder, but not necessarily. The sliding forks 510 and 520 may slide through the use of at least two among the LM guider, the ball screw, and the belt, without using the second fork slider 530. Furthermore, the second bi-directional sliding fork 340 may slide the sliding forks 510 and 520 in the electromagnetic motor type obtained by combining at least one or two of the LM guider, the ball screw and the belt, without using the second fork slider 530.

The second bi-directional sliding fork 340 may further include a position-detecting sensor to control the second fork slider 530 by detecting a sliding position for the bi-directional sliding of the sliding bars 514, 516 and 518.

The second bi-directional sliding fork 340 slides both the third and fourth sliding forks 510 and 520 to the first or second horizontal direction by extending or retracting the third and fourth sliding forks 510 and 520 through the use of second fork slider 530, wherein the first and second horizontal directions are opposite to each other. Thus, the substrate can be bi-directionally transferred to any one of the processing chambers (PCs) arranged along the upper and lower sides of the transfer chamber (TC).

The fork lift 350 according to one embodiment of the present invention includes a first lift supporter 352a, a second lift supporter 352b, a first lifting unit such as a first lift motor 354a, a second lifting unit such as a second lift motor (not shown), a first frame lifting member such as a first ball screw 356a, a second frame lifting member such as a second ball screw 356b, and an interlock member such as an interlock shaft 358.

The first lift supporter 352a is provided for being vertical to the base frame 310 while being confronted with a first lateral side of the fork frame 320.

The second lift supporter 352b is provided for being vertical to the base frame 310 while being confronted with the first lift supporter 352a at a second lateral side of the fork frame 320.

As the first lift motor 354a is provided on the base frame 310 while being adjacent to an inner lateral side of the first lift supporter 352a, the first lift motor 354a rotates the first ball screw 356a to a first or second direction, wherein the first and second directions are opposite to each other.

As the second lift motor is provided on the base frame 310 while being adjacent to an inner lateral side of the second lift supporter 352b, the second lift motor makes the second ball screw 356b rotate to the same direction as that of the first ball screw 356a.

According as the first ball screw 356a is provided between the first lift supporter 352a and the first lift motor 354a while passing through the protrusion 328 provided in the first support frame 322 of the fork frame 320, the first lateral side of the fork frame 320 is lifted by the rotation of the first lift motor 354a. At this time, the protrusion 328 provided in the first support frame 322 forms a screw thread to be engaged with the first ball screw 356a.

According as the second ball screw 356b is provided between the second lift supporter 352b and the second lift motor while passing through the protrusion 328 provided in the first support frame 322 of the fork frame 320, the second lateral side of the fork frame 320 is lifted by the rotation of the second lift motor. At this time, the protrusion 328 provided in the first support frame 322 forms a screw thread to be engaged with the second ball screw 356b.

The interlock shaft 358 is provided between the first lift motor 354a and the second lift motor so as to transfer a rotary power of the first lift motor 354a or second lift motor to another lift motor, whereby the rotation of the first lift motor 354a is interlocked and synchronized with the rotation of the second lift motor.

The fork lift 350 lifts or lowers the fork frame 320 according to the rotation of the first and second ball screws 356a and 356b based on the rotation of the first lift motor 354a and second lift motor, whereby the first or second bi-direction sliding fork 330 or 340 can be lifted or lowered to a predetermined height.

The fork lift 350 may further include a position-detecting sensor to control the rotation of the first lift motor 354a and second lift motor by detecting a lifting position of the fork frame 320.

The fork lift guide 360 according to one embodiment of the present invention includes a plurality of first lift guide members such as first lift guide blocks 362, and a plurality of second lift guide members such as lift guide rails 364.

The plurality of lift guide blocks 362 are provided in the sidewall supporters 324 corresponding to the corners of the first and second lateral sides in the fork frame 320. At this time, two of the lift guide blocks 362 may be provided at each of the first and second lateral sides of the fork frame 320.

The plurality of lift guide rails 364 are provided for being vertical to the base frame 310 while being in contact with each lift guide block 362. Thus, when the fork frame 320 is lifted or lowered, the plurality of lift guide rails 364 guide the lifting or lowering movement of the lift guide blocks 362.

According as the bi-directional substrate transferring device 100 moves to the processing chamber (PC) or load-lock chamber (LC) by the horizontal movement of the moving unit 200, the substrate can be transferred bi-directionally by the bi-directional substrate transferring device 100. Because the bi-directional substrate transferring device 100 bi-directionally transfers the substrate through the bi-directional sliding movement of the first and second bi-directional sliding forks 330 and 340, there is no requirement for the rotation of the substrate when bi-directionally transferring the substrate.

Figure 4:
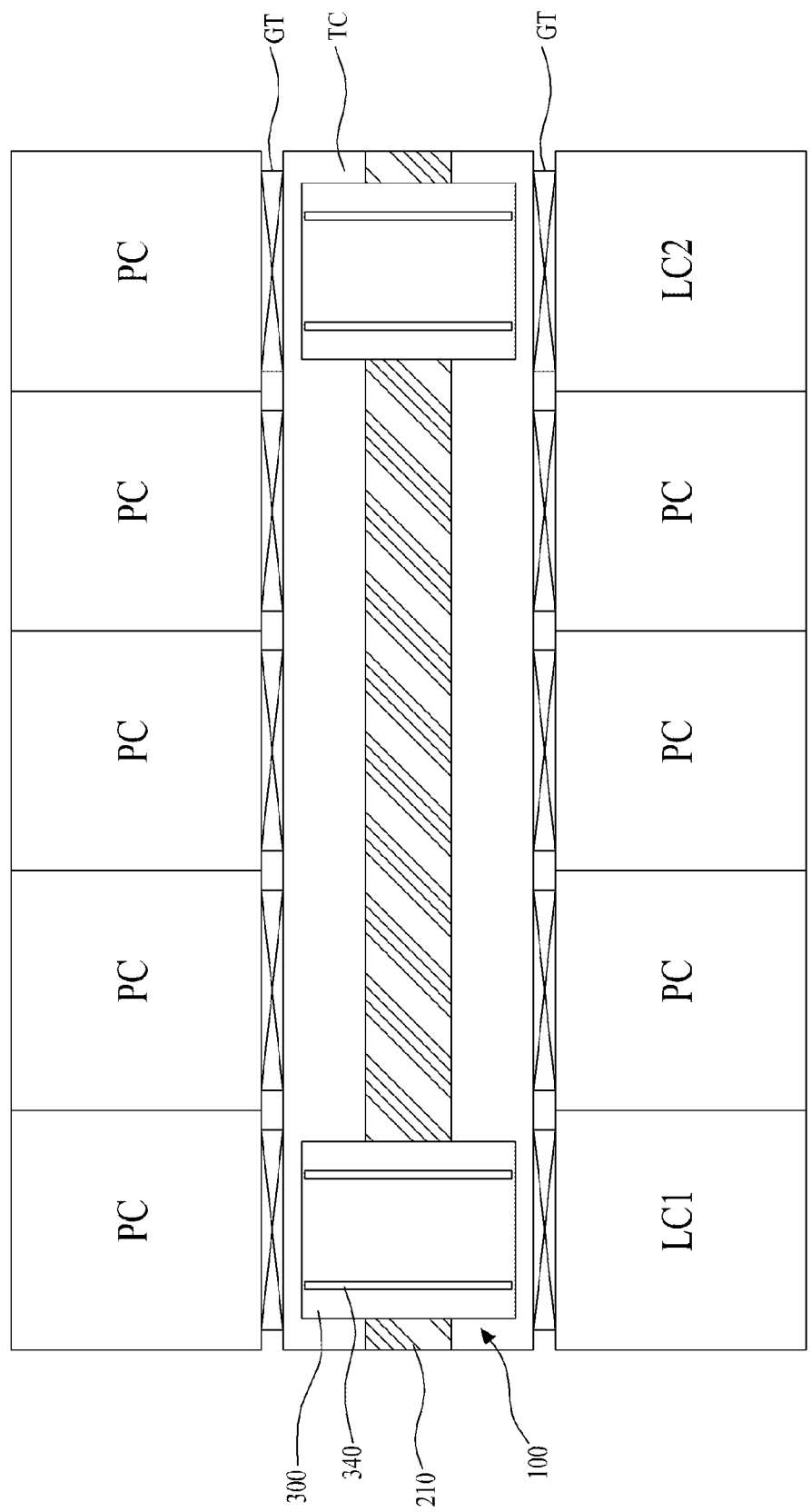
FIG. 4 illustrates a substrate processing system according to the second embodiment of the present invention.

For improving the substrate-transferring efficiency, the aforementioned transfer chamber (TC) may include the plurality of bi-directional substrate transferring devices 100, as shown in FIG. 4. In this case, the number of bi-directional substrate transferring devices 100 may be changed according to the length of the transfer chamber (TC). Each of the bi-directional substrate transferring devices 100 is identical in structure to the aforementioned bi-directional substrate transferring device, whereby each of the bi-directional substrate transferring devices 100 can transfer the corresponding substrate provided in a predetermined area of the transfer chamber (TC). Hereinafter, supposing that the transfer chamber (TC) has one bi-directional substrate transferring device 100.

FIGS. 5 to 8 illustrate the substrate transferring method according to the first embodiment of the present invention in the substrate processing system according to the embodiment of the present invention.

Figure 5:
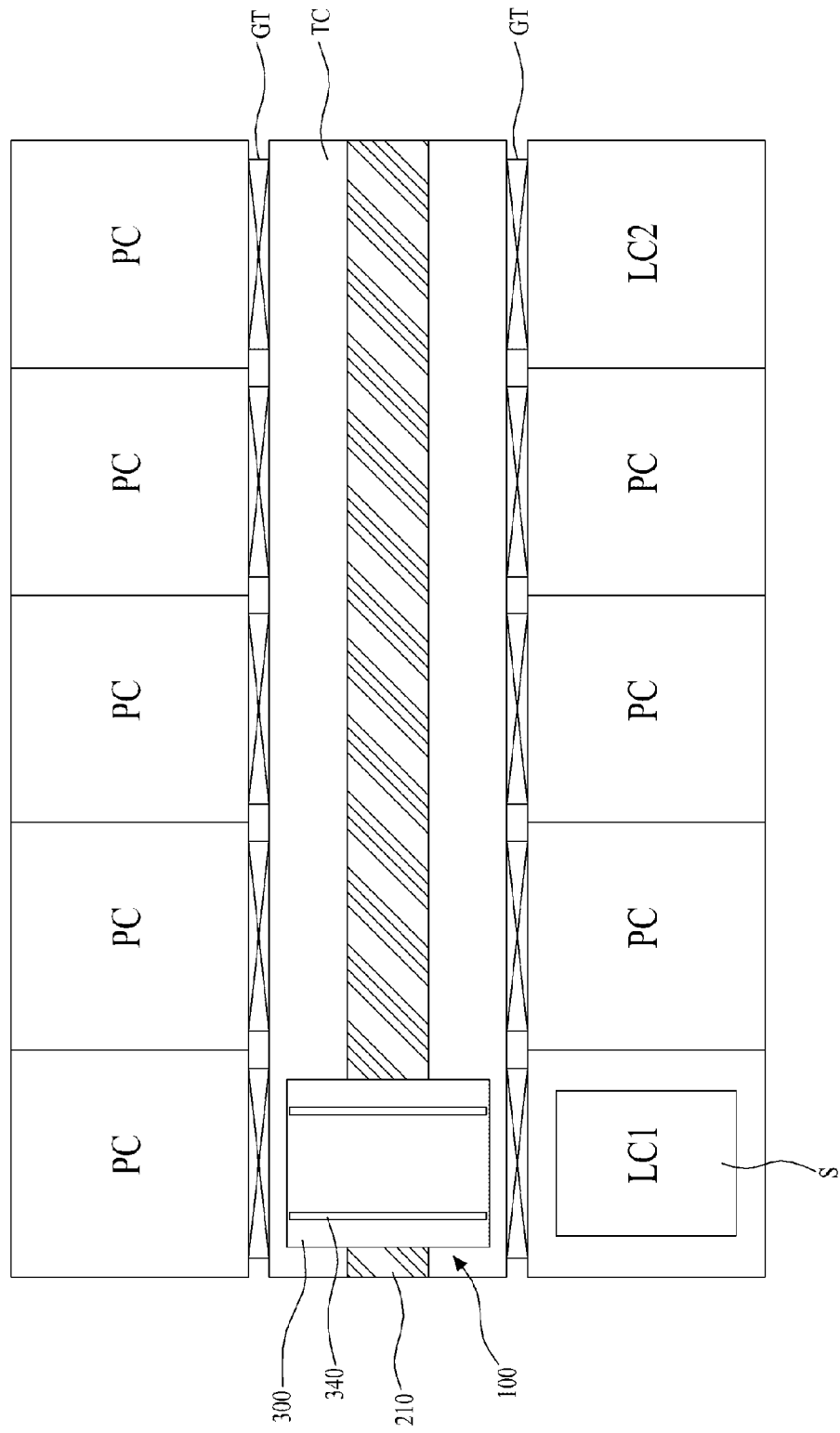
FIGS. 5 to 8 illustrate a substrate transferring method according to the first embodiment of the present invention through the use of substrate processing system according to the embodiment of the present invention.

First, as shown in FIG. 5, when the substrate (S) is transferred to the first load-lock chamber (LC1) from the external, the bi-directional substrate transferring device 100 moves the bi-directional substrate transferring unit 300 to the first load-lock chamber (LC1) by moving the moving unit 200.

Figure 6:
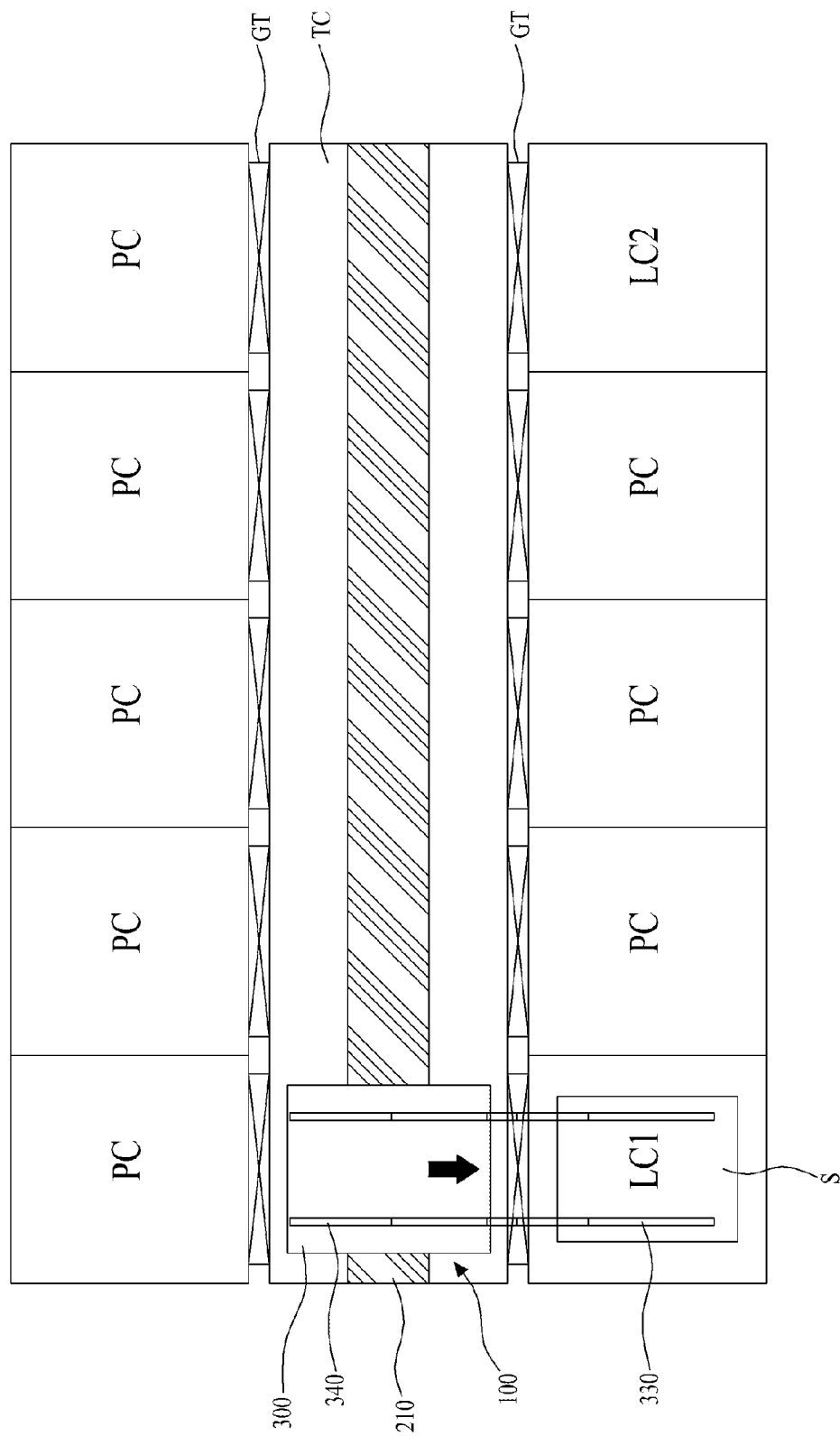

Then, as shown in FIG. 6, the bi-directional substrate transferring device 100 operates the fork lift 350 so that the first bi-directional sliding fork 330 of the fork frame 320 is lifted or lowered to have the same height as the substrate (S) transferred to the first load-lock chamber (LC1). Thereafter, the bi-directional substrate transferring device 100 makes the sliding bars 414, 416 and 418 of the first bi-directional sliding fork 330 slide into the first direction, that is, the inside of the first load-lock chamber (LC1); and then places the substrate (S) onto the first bi-directional sliding fork 330 by lifting the fork frame 320 to the predetermined height through an operation of the fork lift 350.

Figure 7:
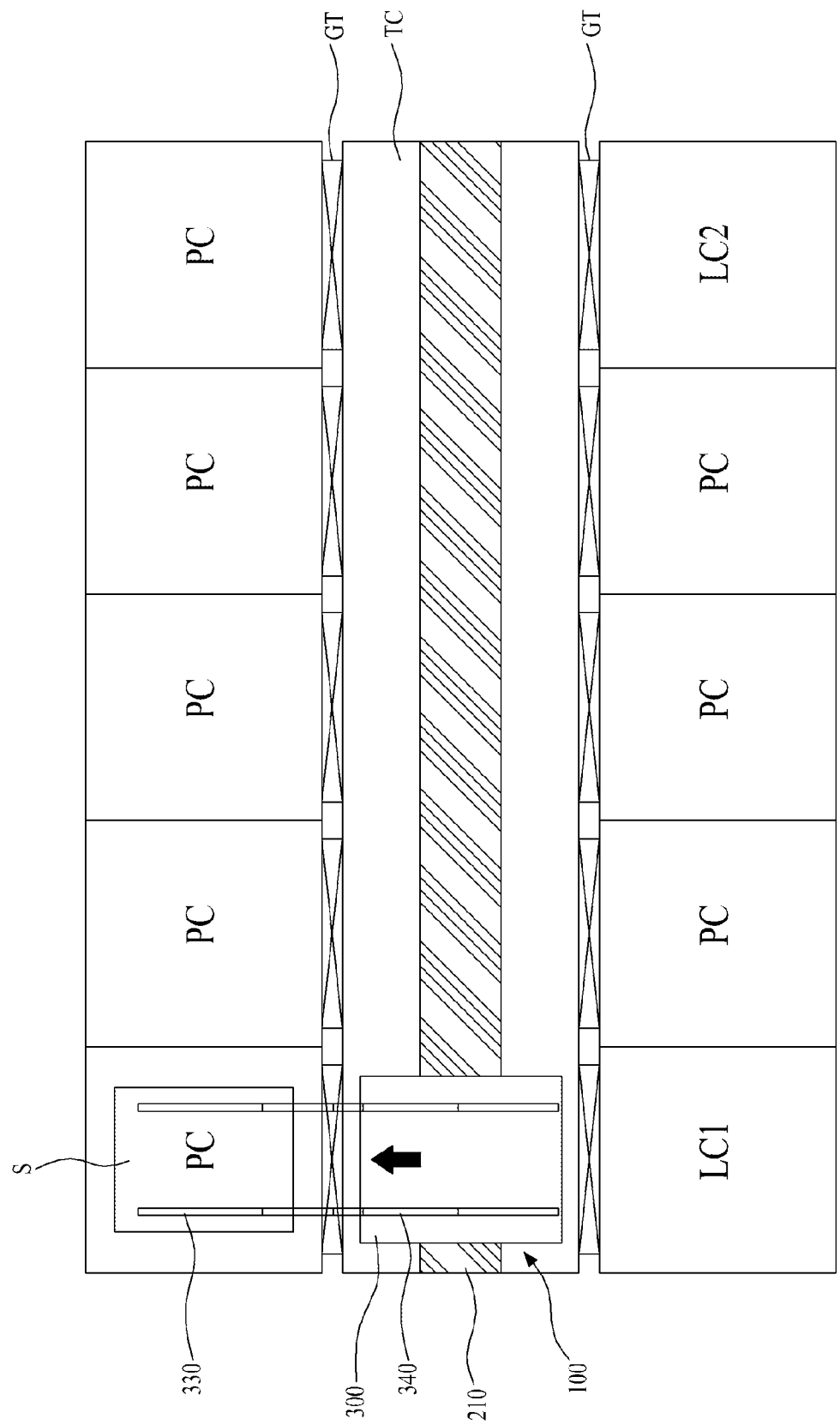

As shown in FIG. 7, the bi-directional substrate transferring device 100 retracts the sliding bars 414, 416, and 418 of the first bi-directional sliding fork 330, onto which the substrate (S) is placed, to their original positions on the fork frame 320; slides the sliding bars 414, 416 and 418 of the first bi-directional sliding fork 330 into the second direction, that is, the inside of the processing chamber (PC); lowers the fork frame 320 to the predetermined height by operating the fork lift 350; and loads the substrate (S) placed onto the first bi-directional sliding fork 330 into the inside of the processing chamber (PC).

Figure 8:
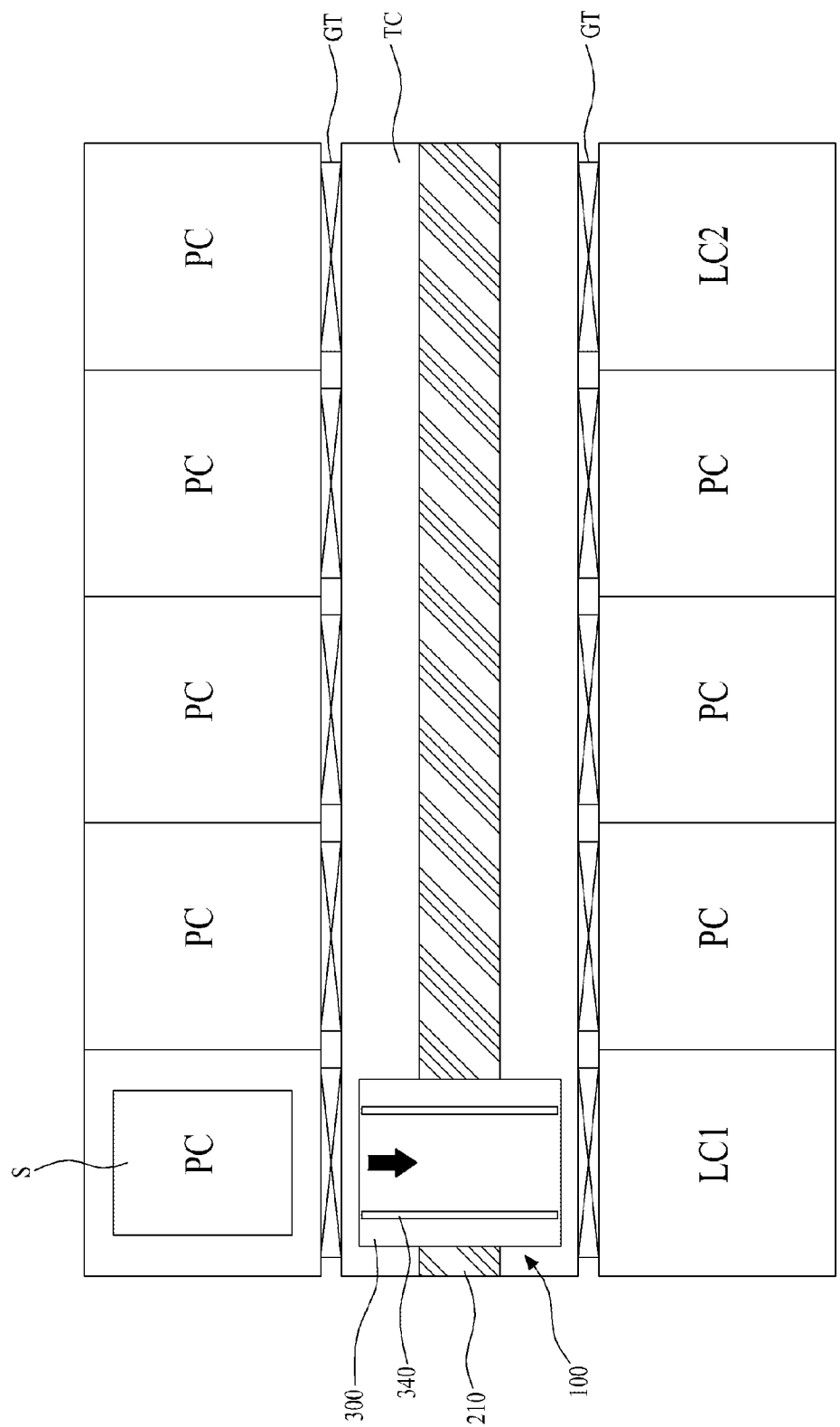

As shown in FIG. 8, when the substrate (S) is loaded into the processing chamber (PC), the bi-directional substrate transferring device 100 slides the sliding bars 414, 416 and 418 of the first bi-directional sliding fork 330 to the second direction, whereby the sliding forks 414, 416 and 418 are retracted to the original positions on the fork frame 320.

FIGS. 9 to 13 illustrate the substrate transferring method according to the second embodiment of the present invention in the substrate processing system according to the embodiment of the present invention.

Figure 9:
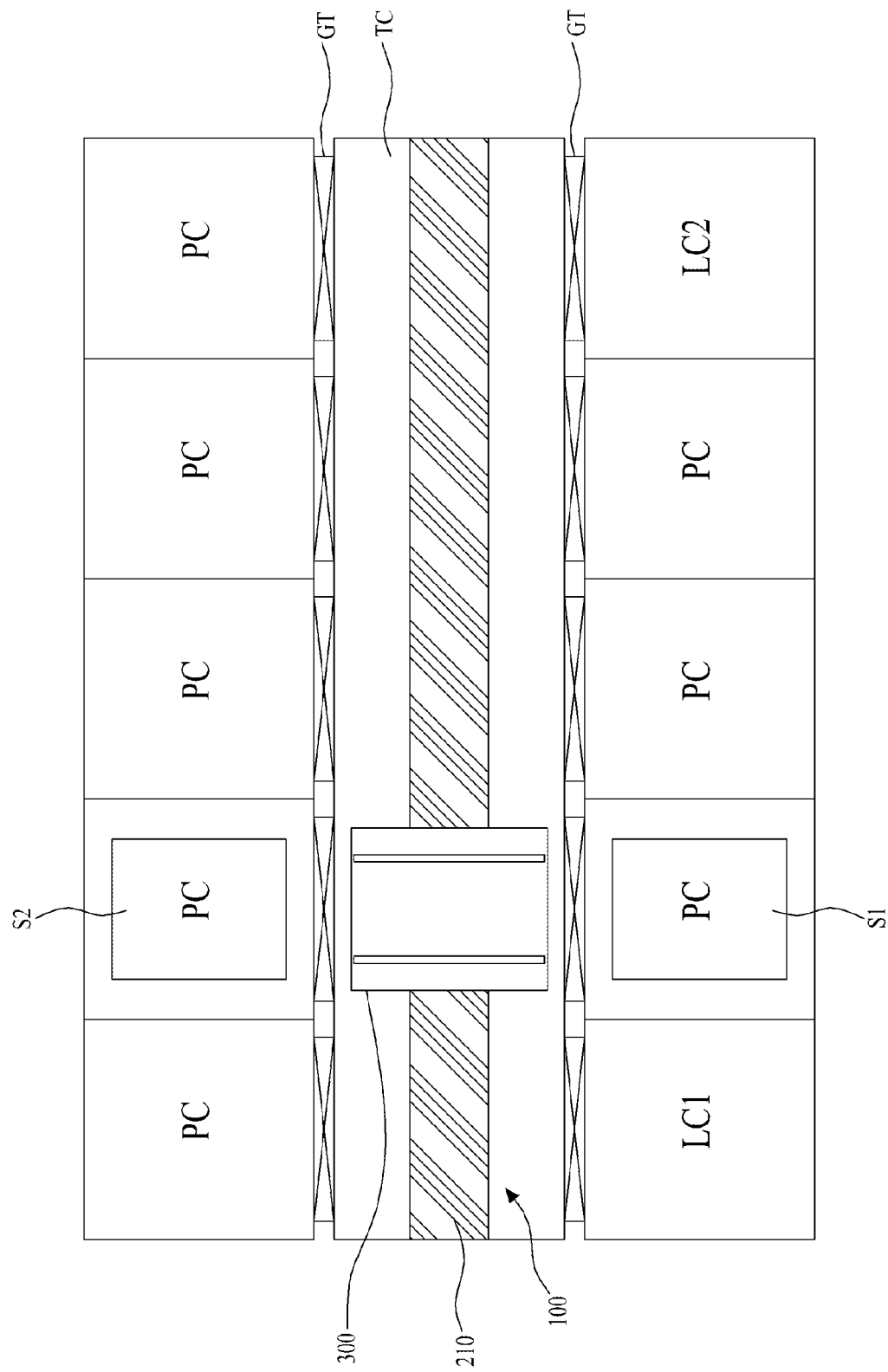
FIGS. 9 to 13 illustrates a substrate transferring method according to the second embodiment of the present invention through the use of substrate processing system according to the embodiment of the present invention.

First, as shown in FIG. 9, when the semiconductor-manufacturing process is completed in both processing chambers (PCs) confronting each other with the transfer chamber (TC) interposed therebetween, the bi-directional substrate transferring device 100 moves the bi-directional substrate transferring unit 300 to the space between the both corresponding processing chambers (PCs) by moving the moving unit 200.

Figure 10:
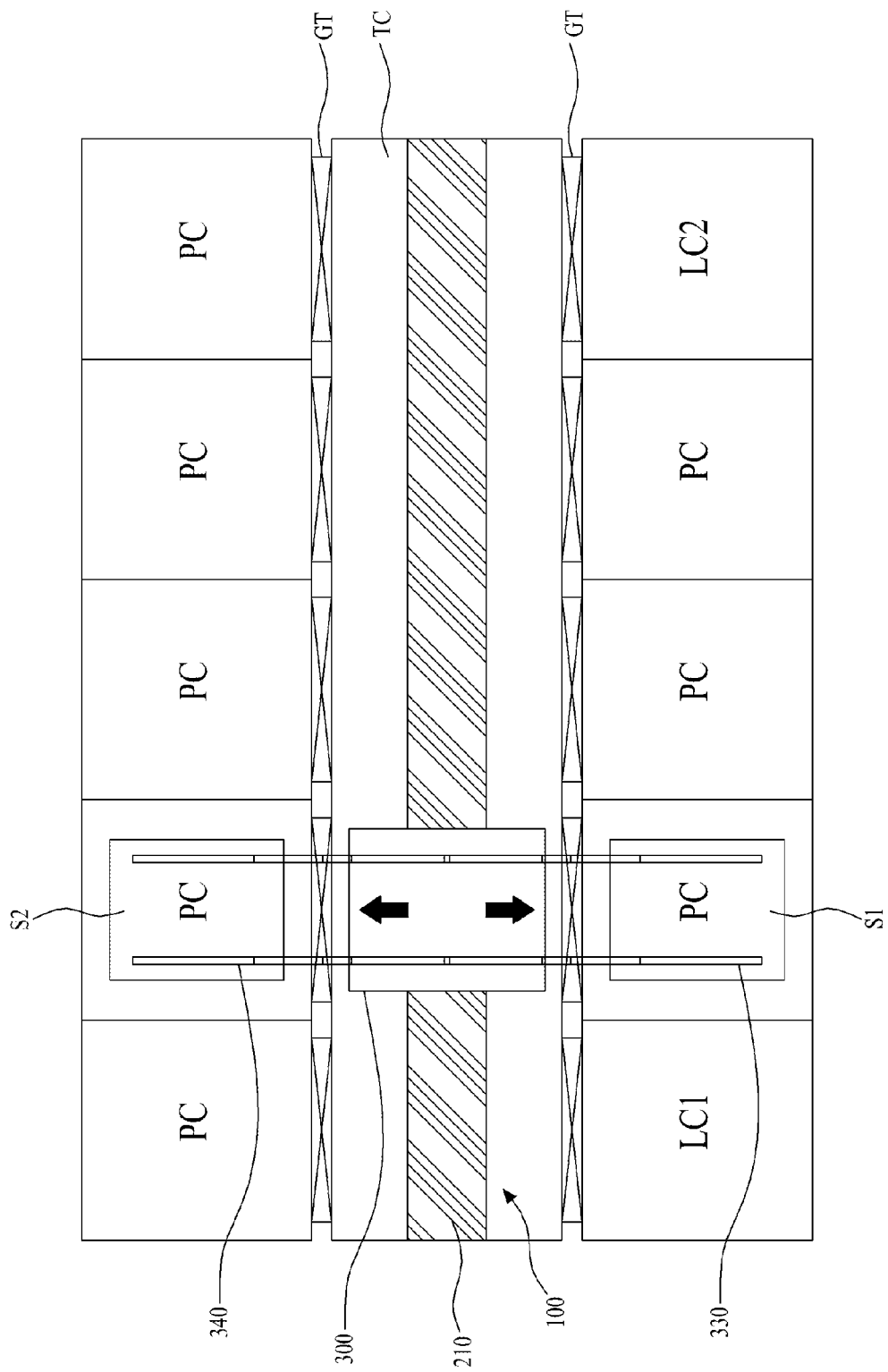

As shown in FIG. 10, the bi-directional substrate transferring device 100 operates the fork lift 350, whereby the first bi-directional sliding fork 330 of the fork frame 320 is lifted until the height of the first bi-directional sliding fork 330 of the fork frame 320 reaches the height of the first substrate (S1) loaded into one corresponding processing chamber (PC) positioned in the upper side of the transfer chamber (TC). Thereafter, the bi-directional substrate transferring device 100 slides the sliding bars 414, 416 and 418 of the first bi-directional sliding fork 330 into the first direction, that is, the inside of one corresponding processing chamber (PC); and places the first substrate (S1) onto the first bi-directional sliding fork 330 by lifting the fork frame 320 to the predetermined height through an operation of the fork lift 350. Then, the bi-directional substrate transferring device 100 slides the sliding bars 414, 416 and 418 of the first bi-directional sliding fork 330 with the first substrate (S1) placed thereon into the second direction, so that the sliding bars 414, 416 and 418 are retracted to their original positions on the fork frame 320, to thereby place the first substrate (S1) onto the fork frame 320.

Figure 11:
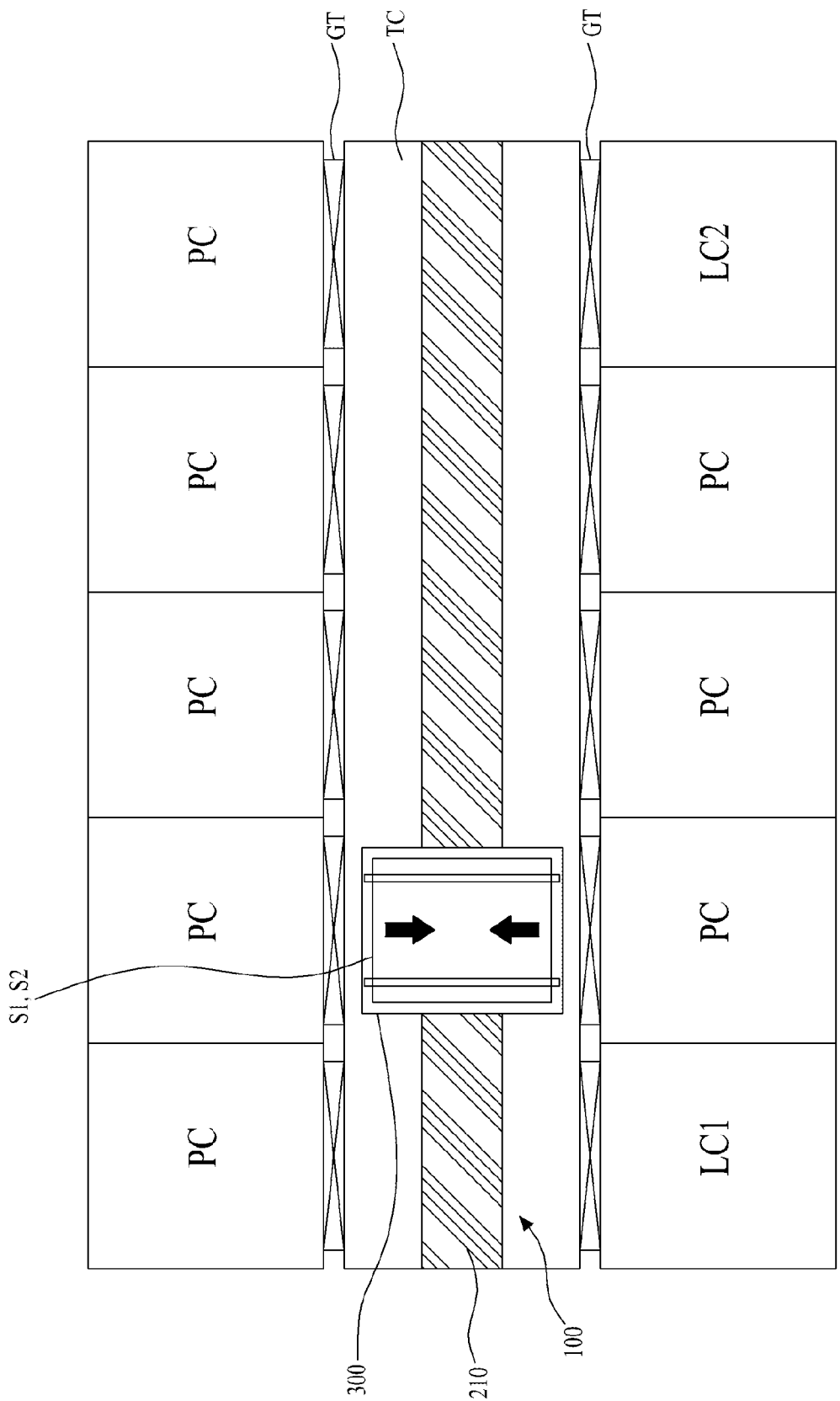

Next, the bi-directional substrate transferring device 100 operates the fork lift 350, whereby the second bi-directional sliding fork 340 of the fork frame 320 is lifted until the height of the second bi-direction sliding fork 340 of the fork frame 320 reaches the height of the second substrate (S2) loaded into the other corresponding processing chamber (PC) positioned in the lower side of the transfer chamber (TC). Then, the bi-directional substrate transferring device 100 slides the sliding bars 514, 516 and 518 of the second bi-directional sliding fork 340 into the second direction, that is, the inside of the other corresponding processing chamber (PC); and places the second substrate (S2) onto the second bi-directional sliding fork 340 by lifting the fork frame 320 to the predetermined height through an operation of the fork lift 350. Thereafter, the bi-directional substrate transferring device 100 slides the sliding bars 514, 516 and 518 of the second bi-directional sliding fork 340 with the second substrate (S2) placed thereon into the first direction, so that the sliding bars 514, 516 and 518 are retracted to their original positions on the fork frame 320, to thereby place the second substrate (S2) onto the fork frame 320. As a result, as shown in FIG. 11, the bi-directional substrate transferring device 100 transfers the first and second substrates (S1, S2) to the both corresponding processing chambers (PCs) confronting each other by bi-directionally sliding the first and second bi-directional sliding forks 330 and 340 in sequence.

If the first and second substrates (S1, S2) are positioned with a predetermined height difference therebetween in such a way that the predetermined height difference between the first and second substrates (S1, S2) is the same as a height difference between the first and second bi-directional sliding forks 330 and 340, the bi-directional substrate transferring device 100 bi-directionally slides the first and second bi-directional sliding forks 330 and 340 at the same time, whereby the first and second substrate (S1, S2) respectively loaded into the both corresponding processing chambers (PCs) confronting each other are transferred to the fork frame 320 at the same time.

Figure 12:
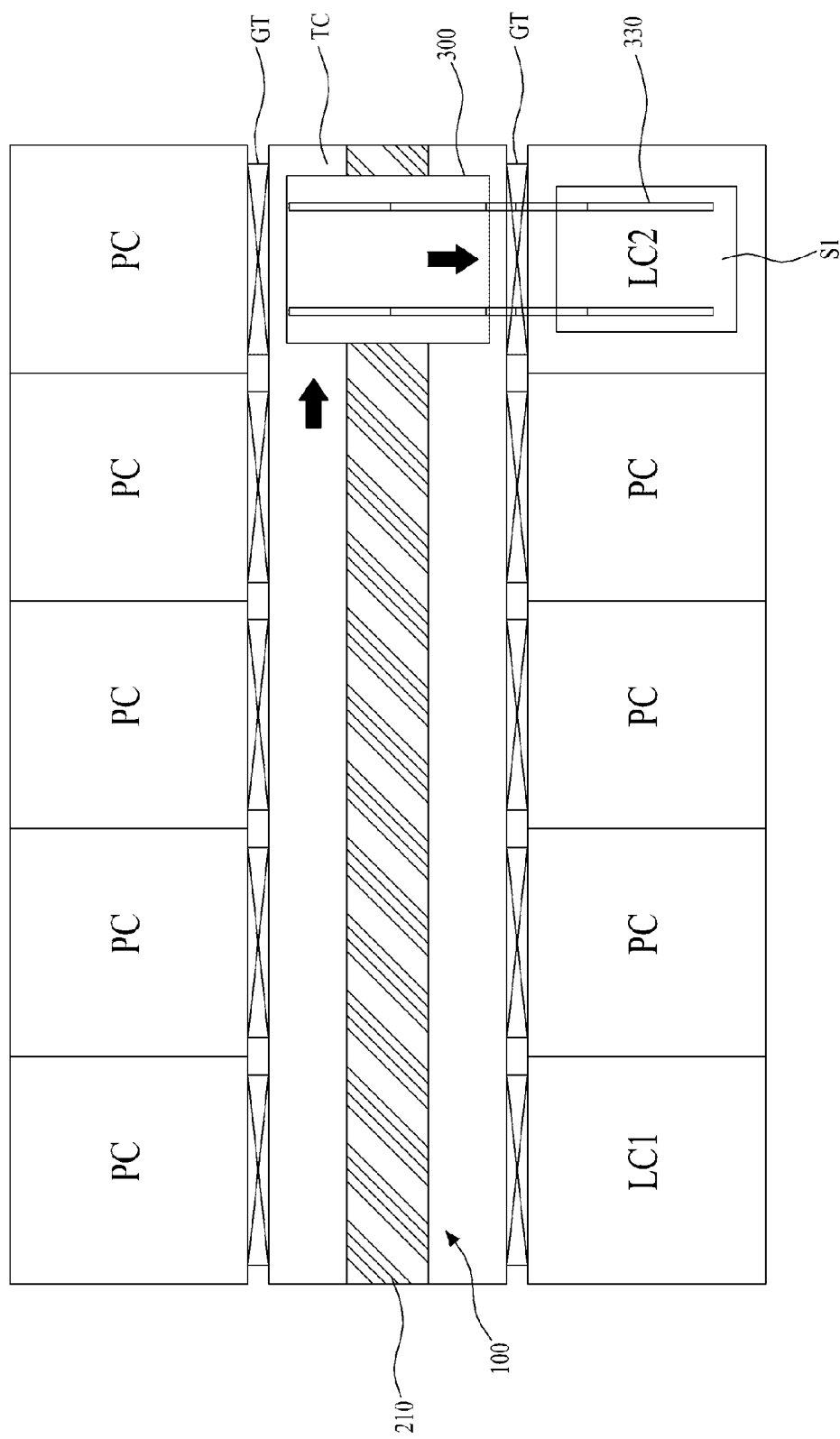

As shown in FIG. 12, the bi-directional substrate transferring device 100 moves the bi-directional substrate transferring unit 300 to the second load-lock chamber (LC2) by moving the moving unit 200; slides the sliding bars 414, 416 and 418 of the first bi-directional sliding fork 330 with the first substrate (S1) placed thereon into the inside of the second load-lock chamber (LC2); lowers the fork frame 320 to the predetermined height by operating the fork lift 350; and loads the first substrate (S1) placed onto the first bi-directional sliding fork 330 into the inside of the second load-lock chamber (LC2). When the first substrate (S1) is loaded into the second load-lock chamber (LC2), the bi-directional substrate transferring device 100 slides the sliding bars 414, 416 and 418 of the first bi-directional sliding fork 330 to be retracted and positioned at their original positions on the fork frame 320.

Figure 13:
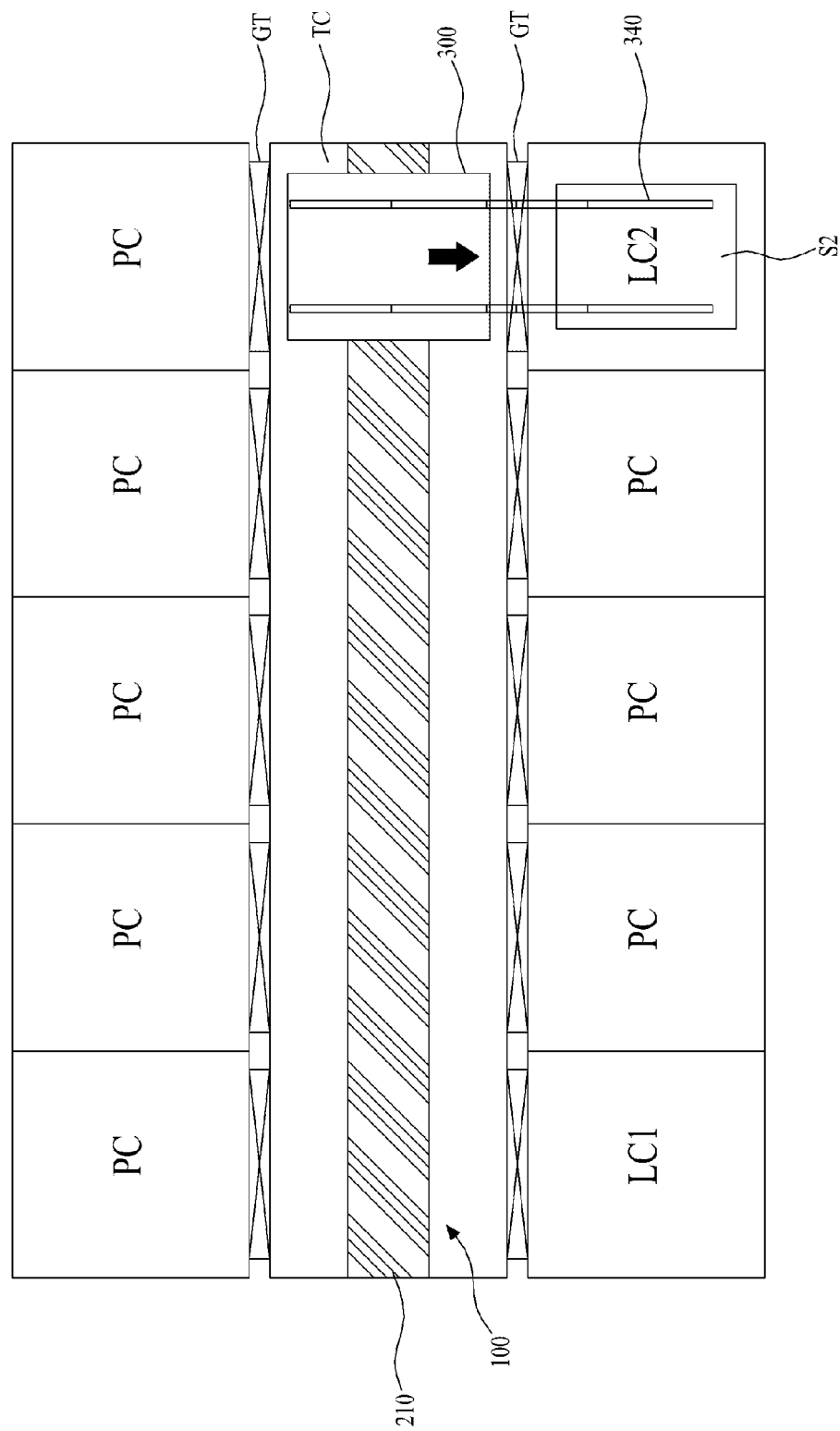

As shown in FIG. 13, when the first substrate (S1) is transferred to the second load-lock chamber (LC2), the bi-directional substrate transferring device 100 slides the sliding bars 514, 516 and 518 of the second bi-directional sliding fork 340 to the inside of the second load-lock chamber (LC2); lowers the fork frame 320 to the predetermined height by operating the fork lift 350; and loads the second substrate (S2) placed onto the second bi-directional sliding fork 340 into the inside of the second load-lock chamber (LC2). Thereafter, when the second substrate (S2) is loaded into the second load-lock chamber (LC2), the bi-directional substrate transferring device 100 slides the sliding bars 514, 516 and 518 of the second bi-directional sliding fork 340 to be retracted and positioned at their original positions on the fork frame 320.

Figure 14:
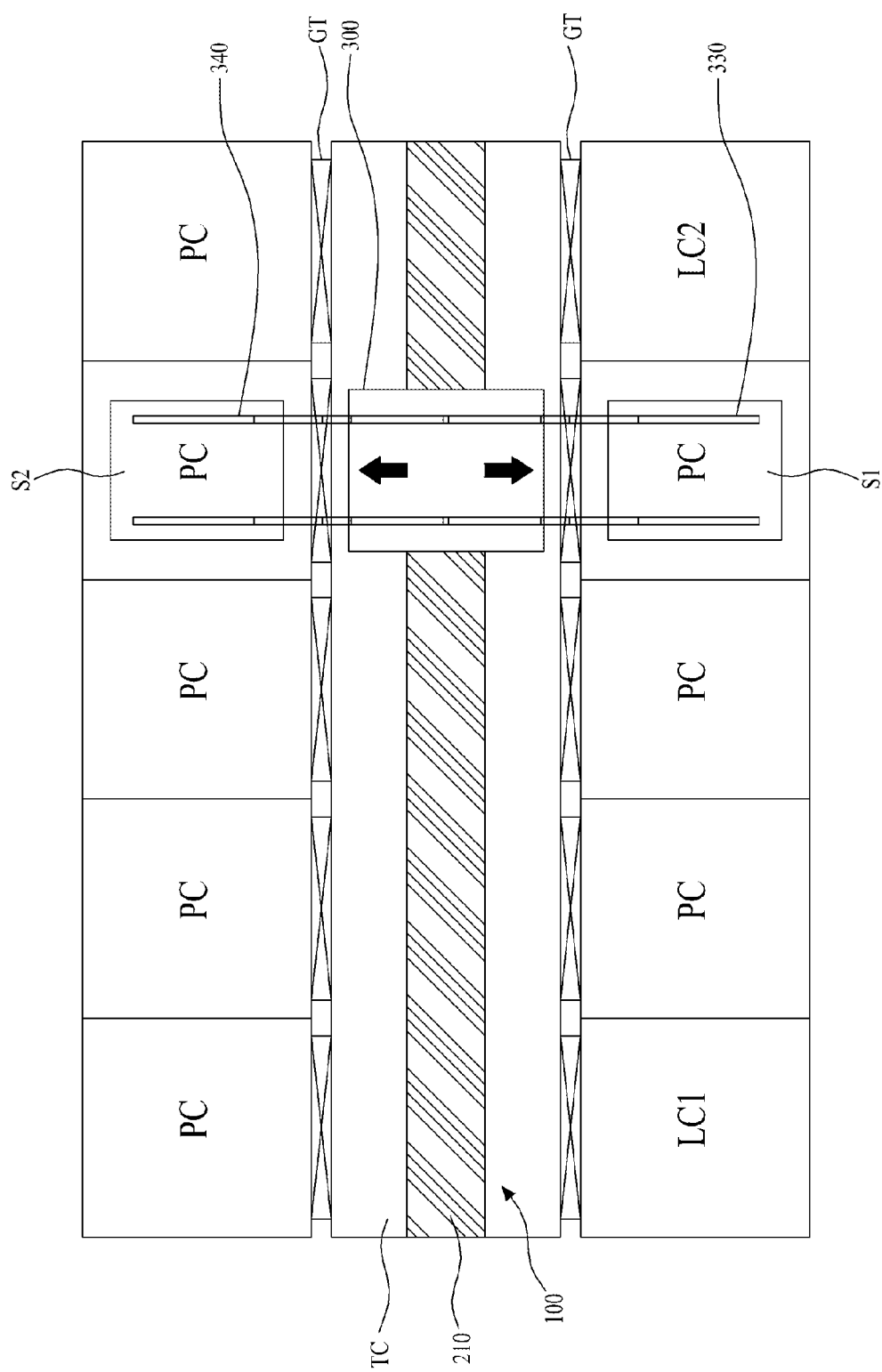
FIG. 14 illustrates a substrate transferring method according to the third embodiment of the present invention through the use of substrate processing system according to the embodiment of the present invention.

According to the substrate transferring method according to the second embodiment of the present invention, the first and second substrates (S1, S2) may be transferred from the corresponding processing chambers (PCs) confronting each other to the other processing chambers (PCs) instead of the second load-lock chamber (LC2), as shown in FIG. 14.

In detail, as shown in FIG. 14, when the first and second substrates (S1, S2) are respectively transferred from the corresponding processing chambers (PCs) confronting each other to the fork frame 320, the bi-directional substrate transferring device 100 moves the substrate transferring unit 300 to the predetermined space between the desired processing chambers (PCs) confronting each other; and loads the first and second substrate (S1, S2) respectively placed onto the first and second bi-directional sliding forks 330 and 340 into the desired processing chambers (PCs) confronting each other in sequence.

According to the aforementioned substrate transferring method, the bi-directional substrate transferring unit 300 can be rapidly moved inside the transfer chamber (TC) through the use of moving unit 200 of the linear motor; the first and second bi-directional sliding forks 330 and 340 can be lifted and lowered through the use of fork lift 350; and the substrate (S) can be bi-directionally transferred through the use of first and second bi-directional sliding forks 330 and 340.

As mentioned above, the substrate processing system and substrate transferring method according to the present invention have the following advantages.

First, the substrate (S) is bi-directionally transferred through the bi-directional substrate transferring device 100 between the two rows of the processing chambers (PCs) arranged linearly, thereby improving the substrate transferring efficiency and enhancing the yield.

According as the substrate (S) is transferred in the bi-directional sliding method, it is possible to minimize the size of transfer chamber (TC), thereby decreasing the maintenance time for the transfer chamber (TC).

Also, the bi-directional substrate transferring unit 300 is horizontally moved through the use of linear motor, whereby the substrate (S) can be transferred with rapidness.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A substrate processing system comprising:
a transfer chamber having at least one bi-directional substrate transferring device configured to transfer a substrate in either of two directions; and
a plurality of processing chambers applying a semiconductor-manufacturing process to the substrate, wherein the plurality of processing chambers are linearly arranged along two rows confronting each other, and the transfer chamber is between the two rows of the processing chambers,
wherein the at least one bi-directional substrate transferring device comprises:
a moving unit inside the transfer chamber, configured to move horizontally; and
a bi-directional substrate transferring unit on the moving unit, the bi-directional substrate transferring unit transferring the substrate to one of the processing chambers by sliding in either of the two directions, comprising:
a base frame on the moving unit;
a fork frame on the base frame, the fork frame having a first support frame, a plurality of sidewall supporters along an edge of the first support frame, and a second support frame confronting the first support frame and in the plurality of sidewall supporters;
first and second bi-directional sliding forks in the fork frame, the first and second bi-directional sliding forks comprising a plurality of sliding members configured to transfer the substrate to a first one of the processing chambers by linearly extending or retracting in a first one of the two directions and to a second one of the processing chambers by linearly extending or retracting in another one of the two directions; and
a fork lift at a lateral side of the fork frame, the fork lift lifting or lowering the first support frame of the fork frame, wherein the fork lift comprises:
first and second lift supporters vertical to the base frame;
first and second lifting units respectively adjacent to inner lateral sides of the first and second lift supporters;
a first frame lifting member between the first lift supporter and the first lifting unit, the first frame lifting member lifting or lowering the fork frame by driving the first lifting unit;
a second frame lifting member between the second lift supporter and the second lifting unit, the second frame lifting member lifting or lowering the fork frame by driving the second lifting unit; and
an interlock shaft between the first and second lifting units, the interlock shaft interlocking the first and second lifting members.

2. The substrate processing system according to claim 1, further comprising a linear motor configured to move the moving unit,
wherein the plurality of sliding members are extended or refracted by hydraulic or pneumatic pressure.

3. The substrate processing system according to claim 1, wherein the bi-directional substrate transferring unit further comprises a fork lift guide guiding movement of the fork frame.

4. The substrate processing system according to claim 3, wherein the fork lift guide comprises:
a plurality of first lift guide members in the sidewall supporters corresponding to lateral sides of the fork frame; and
a second lift guide member in contact with each the first lift guide member, and vertical to the base frame so as to guide the movement of each the first lift guide members when the fork frame is lifted or lowered.

5. The substrate processing system according to claim 1, wherein each of the first and second bi-directional sliding forks further comprises:
a guide block in the support frame; and
a fork slider bi-directionally sliding the plurality of sliding members, the fork slider in each of the first and second support frames,
wherein the plurality of sliding members are in the guide block.

6. A substrate processing system comprising:
first and second processing chambers confronting each other and in parallel, the first and second processing chambers for applying a semiconductor-manufacturing process to a substrate; and
at least one bi-directional substrate transferring device between the first and second processing chambers, the at least one bi-directional substrate transferring device transferring the substrate to the first or second processing chamber by simultaneously sliding a plurality of sliding members, wherein the at least one bi-directional substrate transferring device comprises:
a fork frame (i) having a first support frame, a plurality of sidewall supporters along an edge of the first support frame, and a second support frame confronting the first support frame and in the plurality of sidewall supporters, and (ii) configured to support the plurality of sliding members; and a fork lift at a lateral side of the fork frame, the fork lift lifting or lowering the first support frame of the fork frame, wherein the fork lift comprises:
first and second lift supporters vertical to the base frame;
first and second lifting units respectively adjacent to inner lateral sides of the first and second lift supporters;
a first frame lifting member between the first lift supporter and the first lifting unit, the first frame lifting member lifting or lowering the fork frame by driving the first lifting unit;
a second frame lifting member between the second lift supporter and the second lifting unit, the second frame lifting member lifting or lowering the fork frame by driving the second lifting unit; and
an interlock shaft between the first and second lifting units, the interlock shaft interlocking the first and second lifting members,
wherein each of the plurality of sliding members transfers the substrate to a first one of the processing chambers by linearly extending or retracting in a first one of the two directions and to a second one of the processing chambers by linearly extending or retracting in another one of the two directions.

7. The substrate processing system according to claim 6, further comprising a linear motor configured to move the the at least one bi-directional substrate transferring device, wherein the plurality of sliding members are extended or refracted by hydraulic or pneumatic pressure.

8. A substrate transferring method for transferring a substrate using the substrate processing system of claim 6, comprising:
moving at least one bi-directional substrate transferring device to a predetermined space between the first and second processing chambers; and
transferring the substrate to the first or second processing chamber by simultaneously sliding the plurality of sliding members,
wherein each of the plurality of sliding members is configured to transfer the substrate to a first one of the processing chambers by linearly extending or retracting in a first one of the two directions and to a second one of the processing chambers by linearly extending or retracting in another one of the two directions.

9. The substrate transferring method according to claim 8, further comprising moving the at least one bi-directional substrate transferring device using a linear motor, and extending or retracting the plurality of sliding members by hydraulic or pneumatic pressure.

10. The substrate transferring method according to claim 8, wherein transferring the substrate comprises:
loading a first substrate into the first processing chamber by extending a plurality of first sliding members from their original positions to the first processing chamber, the first sliding members arranged in parallel to a first one of the at least one bi-directional substrate transferring device;
unloading the first substrate from the first processing chamber by retracting the plurality of first sliding members and restoring the plurality of first sliding members with the first substrate supported thereby to their original positions;
loading the first substrate into the second processing chamber by extending the plurality of first sliding members to the second processing chamber; and
retracting the plurality of first sliding members, and restoring the plurality of first sliding members to their original positions.

11. A substrate transferring method for transferring a substrate using the substrate processing system of claim 6, comprising:
moving the at least one bi-directional substrate transferring device to a predetermined space between the first and second processing chambers; and
transferring the substrate to the first or second processing chamber by linearly moving the plurality of sliding members in the at least one bi-directional substrate transferring device,
wherein each of the plurality of sliding members is configured to transfer the substrate to a first one of the processing chambers by linearly extending or retracting in a first one of the two directions and to a second one of the processing chambers by linearly extending or retracting in another one of the two directions.

12. The substrate transferring method according to claim 11, further comprising moving the at least one bi-directional substrate transferring device using a linear motor, and extending or retracting the plurality of sliding members by hydraulic or pneumatic pressure.

13. The substrate transferring method according to claim 11, wherein transferring the substrate comprises:
loading a first substrate into the first processing chamber by extending a first plurality of the plurality of sliding members from their original positions to the first processing chamber, the first plurality of the plurality of sliding members arranged in parallel to a first one of the at least one bi-directional substrate transferring device;
unloading the first substrate from the first processing chamber by retracting the plurality of first plurality of the plurality of sliding members and restoring the first plurality of the plurality of sliding members with the first substrate supported thereby to their original positions;
loading the first substrate into the second processing chamber by extending the first plurality of the plurality of first sliding members to the second processing chamber; and
retracting the first plurality of the plurality of sliding members, and restoring the first plurality of the plurality of sliding members to their original positions.

* * * * *